(12) United States Patent
Nomura et al.

(10) Patent No.: US 7,943,496 B2
(45) Date of Patent: May 17, 2011

(54) METHOD OF MANUFACTURING GAN-BASED TRANSISTORS

(75) Inventors: Takehiko Nomura, Tokyo (JP); Nariaki Ikeda, Tokyo (JP); Shusuke Kaya, Tokyo (JP); Sadahiro Kato, Tokyo (JP)

(73) Assignee: Furukawa Electric Co., Ltd., Tokyo (JP)

( * ) Notice: Subject to any disclaimer, the term of this patent is extended or adjusted under 35 U.S.C. 154(b) by 0 days.

(21) Appl. No.: 12/707,376

(22) Filed: Feb. 17, 2010

(65) Prior Publication Data

US 2010/0210080 A1    Aug. 19, 2010

(30) Foreign Application Priority Data

Feb. 18, 2009   (JP) .................................. 2009-034725

(51) Int. Cl.
*H01L 21/265* (2006.01)
(52) U.S. Cl. ...................................................... 438/522
(58) Field of Classification Search .................. None
See application file for complete search history.

(56) References Cited

U.S. PATENT DOCUMENTS

| | | | |
|---|---|---|---|
| 7,419,892 B2 * | 9/2008 | Sheppard et al. | 438/522 |
| 7,632,745 B2 * | 12/2009 | Chen | 438/591 |
| 2010/0224910 A1 * | 9/2010 | Ando et al. | 257/192 |
| 2010/0276732 A1 * | 11/2010 | Ando et al. | 257/192 |

FOREIGN PATENT DOCUMENTS

WO           03071607 A1    8/2003

* cited by examiner

*Primary Examiner* — Charles D Garber
*Assistant Examiner* — Andre' C Stevenson
(74) *Attorney, Agent, or Firm* — Turocy & Watson, LLP (57) ABSTRACT

A method of manufacturing a GaN-based field effect transistor is provided by which a lower resistance and a higher breakdown voltage are obtained and which is less affected by a current collapse. A method of manufacturing the GaN-based field effect transistor(s) can comprise performing an epitaxial growth of an AlN layer (102), of a buffer layer (103), of a channel layer (104), of a drift layer (105) and of an electron supplying layer (106) in such the order on to a substrate (101) respectively; forming a recess part (108) thereon; performing an alloying process for performing an annealing in order to obtain an ohmic contact; forming a passivation layer (113) at a period of performing the annealing in the alloying process in order to protect the electron supplying layer (106) on to a surface of the recess part (108), on to the electron supplying layer (106), on to a source electrode (109) and on to a drain electrode (110), respectively; removing the passivation layer (113); forming a gate insulating film on to a surface at the inner side of the recess part (108), on to the electron supplying layer (106), on to the source electrode (109) and on to the drain electrode (110), respectively; and forming a gate electrode on to the gate insulating film at a part of the recess part (108).

3 Claims, 8 Drawing Sheets

FIG. 8

METHOD OF MANUFACTURING GAN-BASED TRANSISTORS

CROSS-REFERENCE TO RELATED APPLICATIONS

This application claims priority from Japanese patent application serial No. 2009-034725, filed on Feb. 18, 2009, the entire content of which is incorporated herein by reference.

BACKGROUND OF THE INVENTION

1. Field of the Invention

The present invention relate to a method of manufacturing a GaN-based field effect transistor that is formed of a nitride based compound semiconductor which is to be made use such as a device for a usage of a power electronics or a device for an amplification of high frequency or the like.

2. Description of the Related Art

A wide band gap semiconductor that is represented by a nitride based compound semiconductor of the III-V group has a high breakdown voltage, has an excellent property of an electronic transport, and has high heat conductivity. And then therefore the same is attractive as extremely for a material of a semiconductor device for a usage of such as a higher temperature, of a higher power or of a higher frequency. Moreover, in accordance with such as a field effect transistor (an FET) that has a hetero structure of an AlGaN/GaN or the like there is generated a two dimensional electron gas at an interface of therebetween due to the spontaneous and piezoelectric polarization effect. Further, such the two dimensional electron gas has a high electron mobility and a high carrier density. And then thereby becoming for a hetero junction FET (an HFET) for which there is designed to be made use of the hetero structure of the AlGaN/GaN to have an ON resistance to be as lower and to have a switching speed to be as faster as well. And hence it becomes possible to perform an operation under a high temperature. And then therefore in accordance with each of such the characteristics such the device becomes to be suitable as extremely for an application of a power switching.

Here, the ordinary AlGaN/GaN HFET is a device of a normally ON type in which there is designed to be flowed an electrical current at a period when there is not applied any bias at all to a gate, and in which there is designed to be cut off such the electrical current by applying an negative potential to the gate. On the other hand, for the application of the power switching, it is preferable to be as a normally OFF type in which there is designed not to be flowed any electrical current at all at the period when there is not applied any bias at all to the gate, and in which there is designed to be flowed such the electrical current by applying the positive potential to the gate, in order to ensure a safety at a time when the device is broken down.

In accordance with the following patent document 1 there is disclosed a field effect transistor (an MOSFET), in which there is designed for an electron supplying layer that is formed of such as an AlGaN or the like to be performed an etching off at a gate part, and then thereafter there is designed to be performed a formation of an insulating layer on to an etched surface of a drift layer, and hence there becomes to be a metal oxide semiconductor (MOS) structure. And then in accordance with such the structure there is designed to be performed a formation of a hetero junction structure that is comprised of a structure of the AlGaN and a GaN for between the gate and a drain. And then therefore it becomes able to prevent an ON resistance from increasing even under a state of a sheet carrier density to be required for maintaining the higher breakdown voltage, because the two dimensional electron gas that is to be performed the formation at the interface of such the hetero junction becomes to have a high electron mobility. That is to say, such the structure is suitable for realizing the high breakdown voltage and the lower resistance.

[Patent Document 1] Patent Application No. WO 03/071607

However, there are some points at issue that will be described in detail below in accordance with such the conventional technology which is disclosed in the patent document 1 which is mentioned above.

For example, such the structure of the two dimensional electron gas of the AlGaN/GaN receives an effect of a phenomenon that is called a current collapse of which there becomes to be varied an amount of the electrical current with corresponding to a passage of time. And then there becomes to be effected as negatively on the property of the device, such as an increase in the ON resistance after applying a high voltage to between the gate and the drain or the increase in the ON resistance at a period of energizing in a forward direction or the like.

And then as a cause of such the current collapse it is considered that there is effected due to such as an interface state of between the AlGaN layer and a passivation layer in the HFET or a deep energy level at an inner side of a channel layer (the drift layer) in the HFET or the like. Moreover, a damage on a surface of the AlGaN layer that is to be generated due to a heat history at a period of an alloying process in order to perform an ohmic contact of between a source electrode and a drain electrode in the HFET, and a generation of a reaction product of between the AlGaN layer and the passivation layer are the one of the causes for worsening the interface state in accordance with a manufacturing process.

SUMMARY OF THE INVENTION

And then therefore the present invention is provided with having regard to the subjects that are described above, and then an objective is to provide a method of manufacturing a GaN-based field effect transistor by which it becomes able to obtain a resistance to be as lower and to withstand against a higher voltage and to be less affected due to a collapse phenomenon of an electrical current.

A method of manufacturing a GaN-based field effect transistor regarding one aspect in accordance with the present invention is characterized in that the same comprises the following steps of: performing an epitaxial growth of a channel layer that is formed of a GaN-based semiconductor on to a substrate; performing an epitaxial growth of an electron supplying layer which is formed of a GaN-based semiconductor on to the channel layer, that has a larger band gap energy than that of the channel layer; forming a recess part that has a bottom face to be as a surface of the channel layer, by etching and removing a part of the electron supplying layer, and then by exposing the surface; forming a source electrode and a drain electrode on to the electron supplying layer; forming a first insulating film on to a surface at an inner side of the recess part, on to the electron supplying layer, on to the source electrode and on to the drain electrode, respectively; performing an alloying process in order to perform an annealing for the source electrode and for the drain electrode; removing the first insulating film after performing the alloying process; forming a second insulating film on to a surface at the inner side of the recess part and on to the electron supplying layer, respectively; and forming a gate electrode on to the second insulating film at a part of the recess part.

And then by making use of the method of manufacturing in accordance with the present invention it becomes able to manufacture a field effect transistor by which it becomes able to function as a normally OFF type, and also by which it becomes able to realize a low ON resistance and it becomes able to realize a fast switching operation by making use of the two dimensional electron gas that is to be generated at the interface of between the channel layer and the electron supplying layer. Moreover, it becomes able to reduce a damage on to the surface of the electron supplying layer at the period of performing the alloying process, because there is designed to be performed such the alloying process in order to perform the ohmic contact under a state of which there is designed to be performed the formation of the other passivation layer (the first insulating film) that is different from the previous insulating film (the second insulating film) after performing the formation of the source electrode and of the drain electrode but before performing the formation of such the second insulating film. Furthermore, it becomes able to reduce an interface state of between the electron supplying layer and the insulating film, because there is designed to be removed a reaction product of between the electron supplying layer and the passivation layer as well at the period of performing the removing of such the passivation layer, and then because there is designed to be performed the formation of the other insulating film thereafter to be as afresh on to the electron supplying layer.

The above and other objects, features, advantages and technical and industrial significance of this invention will be better understood by reading the following detailed description of presently preferred embodiments of the invention, when considered in connection with the accompanying drawings.

DETAILED DESCRIPTION OF THE PREFERRED EMBODIMENTS

Each of the embodiments that are to be embodied in accordance with the present invention will be described in detail below, with being based on the drawings. Here, there will be omitted a duplicated description by being designated a similar part with making use of the similar symbol regarding the description for each of the embodiment.

The First Embodiment

Figure 1:
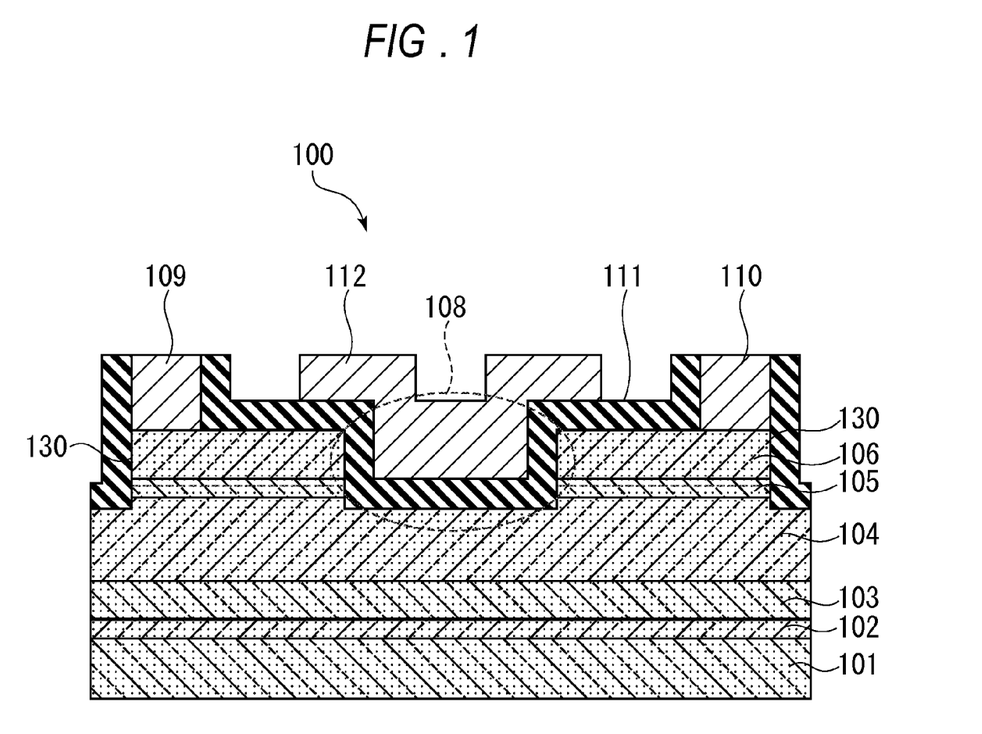
FIG. 1 is a cross sectional view exemplary showing an MOSFET that is to be manufactured by making use of a method of manufacturing regarding one embodiment in accordance with the present invention.

Here, FIG. 1 is a cross sectional view for exemplary showing a GaN-based field effect transistor (hereinafter refer to as an MOSFET) that is to be manufactured by making use of a method of manufacturing regarding one embodiment in accordance with the present invention. And then in accordance with such an MOSFET (100) there are designed to be performed a formation of an AlN layer (102) on to a substrate (101) that is to be comprised of such as a sapphire or an SiC or Si or the like, of a buffer layer (103) that is to be formed by performing a lamination of a GaN layer and an AlN layer as alternately thereon, and then of a channel layer (104) that is to be formed of a p-GaN thereon, respectively. Moreover, there are designed to be performed a lamination of a drift layer (105) that is to be formed of an undoped GaN (un-GaN) and then of an electron supplying layer (106) that has a band gap energy to be as larger with comparing to that of the drift layer (105) one after the other on to the channel layer (104).

Further, there is designed to be performed a formation of a recess part (108) by removing a part of the drift layer (105) and a part of the electron supplying layer (106) to a depth that is to be reaching to the channel layer (104). Still further, there are designed to be performed a formation of a source electrode (109) and of a drain electrode (110) on to the electron supplying layer (106) so as to sandwich the recess part (108). Still further, there is designed to be performed a formation of a gate insulating film (111) (a second insulating film) that is to be formed of $SiO_2$ over a surface at an inner side of the recess part (108) and over a top surface of the electron supplying layer (106). Still further, there is designed to be performed a formation of a gate electrode (112) on to the gate insulating film (111).

Still further, there is designed for the surface of the channel layer (104) at the inner side of the recess part (108) to be located in a vicinity of an upper surface of the channel layer (104) in accordance with the drawing. However, it may be available for a depth of such the surface to be reaching to at least the drift layer (105). That is to say, it may be available for the recess part (108) to be performed the formation so as to perform an isolation of a two dimensional electron gas that is to be performed a formation in between the electron supplying layer (106) and the drift layer (105) into a part for a source side and the other part for a drain side. And then if a bottom part of the recess part (108) becomes to be reaching to the drift layer (105) in such the case thereof there becomes not to be performed a formation of any hetero junction at all, and hence there becomes not to be further generated the two dimensional electron gas at all.

And thus such the MOSFET (100) becomes to be performed an operation as a normally OFF type. Furthermore, it becomes able to realize a low ON resistance and a fast switching operation by making use of the two dimensional electron gas that is to be generated at an interface of between the drift layer (105) and the electron supplying layer (106).

Next, a method of manufacturing the GaN-based field effect transistor regarding the one embodiment in accordance with the present invention will be described in detail below, by which there becomes able to be manufactured such the MOSFET (100). Here, each of FIG. 2 through FIG. 8 is an explanatory drawing for explaining the method of manufacturing the GaN-based field effect transistor in accordance with the one embodiment in order to manufacture the MOSFET (100) that is shown in FIG. 1. And then a case where there is designed for each of the semiconductor layers to be performed a formation will be described in detail below, by making use of a metalorganic chemical vapor deposition (MOCVD) method. However, the present invention is not to be limited in particular to such the method.

Figure 2:
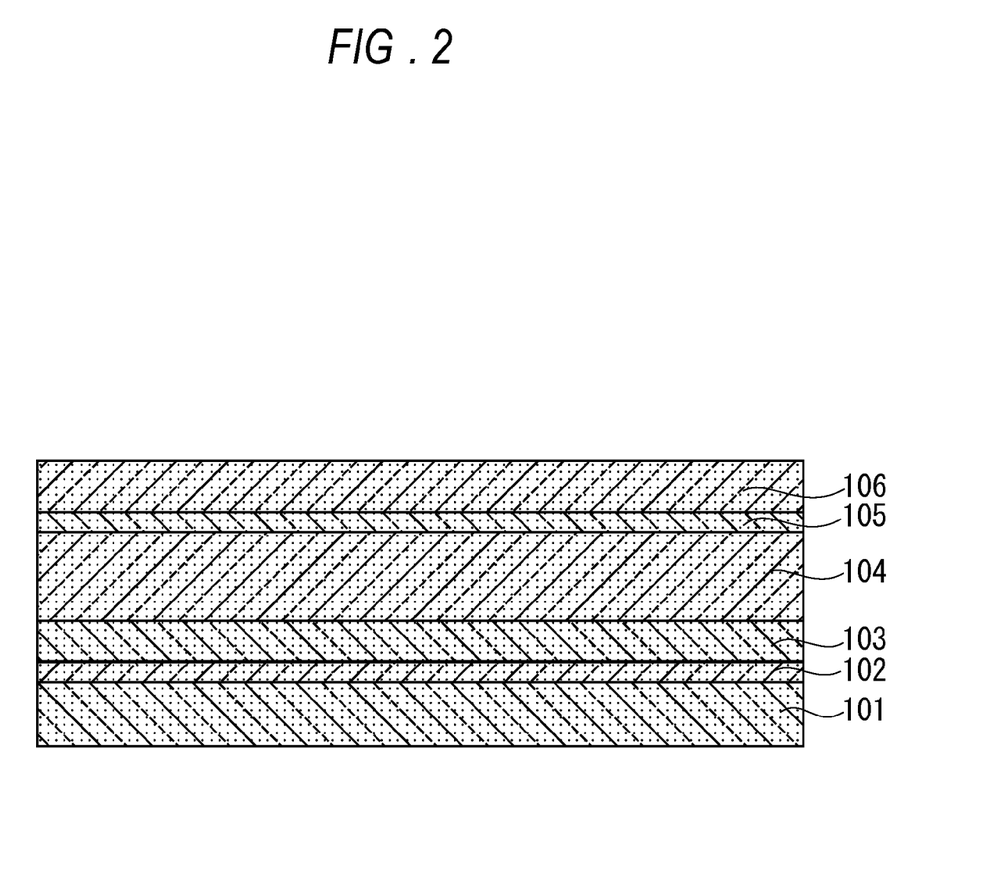
FIG. 2 is an explanatory drawing explaining a method of manufacturing a GaN-based field effect transistor in accordance with the one embodiment in order to manufacture the MOSFET that is shown in FIG. 1.

In the first, there is designed to be performed a setting up of the substrate (101) that is formed of Si with an (111) plane to be as a principal surface plane in an equipment for the MOCVD, and then thereafter there is designed to be performed an introduction of a trimethylgallium (TMGa) and of a trimethylaluminum (TMAl) and of an $NH_3$ with making use of a hydrogen gas to be as a carrier gas, and then thereafter there is designed to be performed an epitaxial growth of the AN layer (102) and then of the buffer layer (103) and then of the channel layer (104) that is to be formed of p-GaN one after the other on to the substrate (101) with a temperature for the growth to be as approximately 1050° C., that are shown in FIG. 2. Moreover, there is designed to be made use of biscyclopentadienyl magnesium ($Cp_2Mg$) to be as a source for doping of the p-type for the channel layer (104). And then there is designed to be performed a control of a flow rate of the $Cp_2Mg$ so as to be as approximately $1\times10^{17}$ cm$^{-3}$ for a concentration of the Mg therein. Next, there is designed to be performed an introduction of the TMGa and of the $NH_3$ thereinto, and then thereafter there is designed to be performed an epitaxial growth of the drift layer (105) that is to be formed of the un-GaN on to the channel layer (104) with a temperature for the growth to be as approximately 1050° C. Next, there are designed to be performed an introduction of the TMAl and of the TMGa and of the $NH_3$ thereinto, and then thereafter there is designed to be performed an epitaxial growth of the electron supplying layer (106) that is to be formed of the AlGaN on to the drift layer (105) with having a composition of the Al to be as approximately 25%.

Further, in accordance with the above description there is designed for the buffer layer (103) to be performed a lamination of a composite lamination of the GaN and the AlN to be as eight layers that individually have a layer thickness to be as 200 nm and as 20 nm respectively. Furthermore, there is designed for each layer thickness of the AlN layer (102), of the channel layer (104), of the drift layer (105) and of the electron supplying layer (106) to be as 100 nm, 500 nm, 100 nm and 20 nm respectively.

Figure 3:
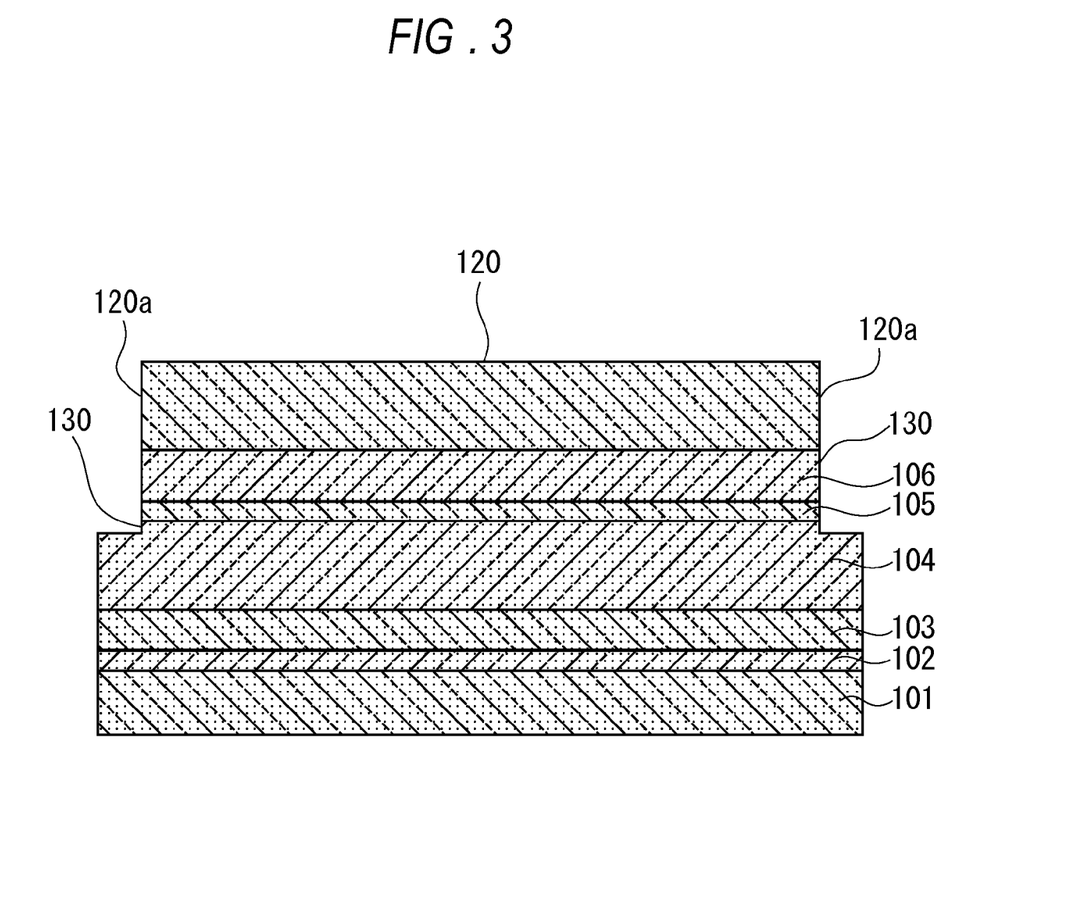
FIG. 3 is an explanatory drawing explaining a method of manufacturing a GaN-based field effect transistor in accordance with the one embodiment.

Next, there is designed to be formed a mask layer (120) that is to be formed of a silicon di-oxide ($SiO_2$) with having a layer thickness to be as 500 nm on to the electron supplying layer (106) by making use of a method of a plasma chemical vapor deposition growth (PCVD), and then thereafter there is designed to be performed a patterning process by making use of a method of a photolithography and with making use of a $CF_4$ gas, and hence there is designed to be performed a formation of an open part (120a) on to the mask in order to perform the isolation of the device, that are shown in FIG. 3. Moreover, by making use of the mask layer (120) to be as the mask, and with making use of a $Cl_2$ gas that is to be as a gas for etching, there is designed to be performed a formation of a part for isolating the device (130) by etching and removing a part of the channel layer (104) and a part of the drift layer (105) and a part of the electron supplying layer (106).

Figure 4:
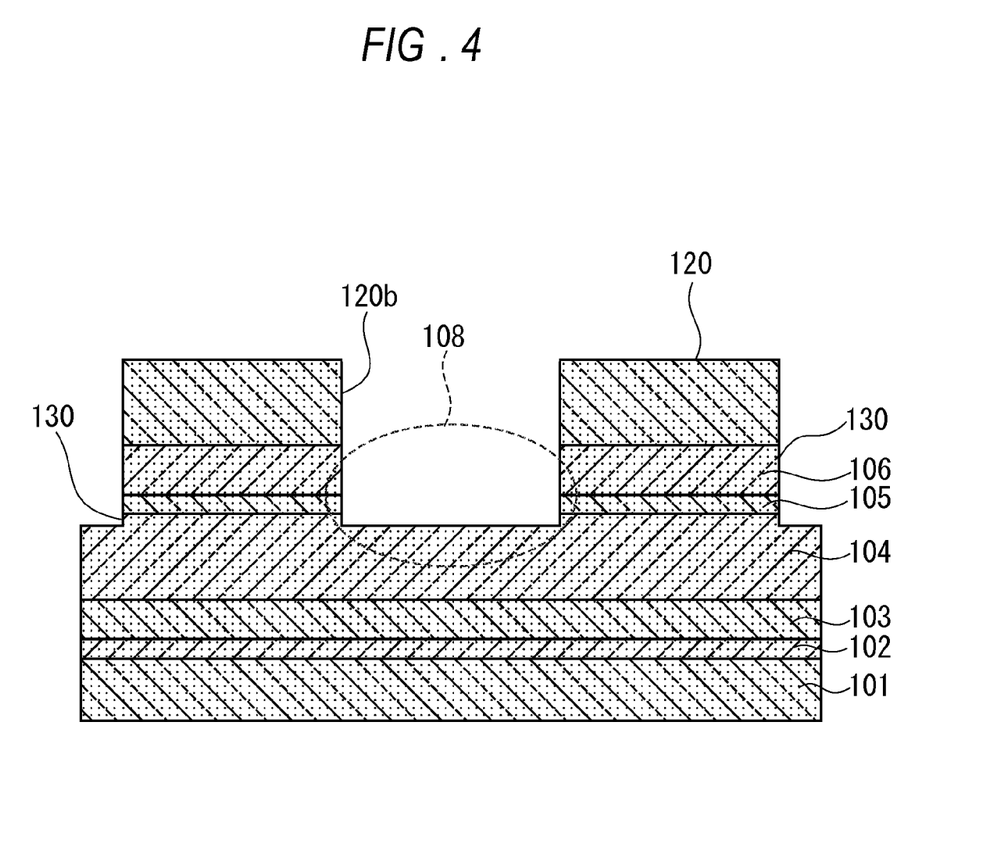
FIG. 4 is an explanatory drawing explaining a method of manufacturing a GaN-based field effect transistor in accordance with the one embodiment.

Next, there is designed to be performed a patterning of the mask layer (120) by making use of the method of the photolithography and with making use of the $CF_4$ gas, and then there is designed to be performed a formation of an open part (120b) in order to perform a formation of a recess part, that are shown in FIG. 4. Moreover, by making use of the mask layer (120) to be as the mask, and with making use of the $Cl_2$ gas that is to be as the gas for etching, there is designed to be performed a formation of a recess part (108) that becomes to have a surface of the channel layer (104) to be as a bottom face by etching and removing a part of the channel layer (104) and a part of the drift layer (105) and a part of the electron supplying layer (106).

Here, the mask layer (120) becomes to be performed the etching from the surface. And then therefore there is designed for such the mask layer (120) to have a thickness to be thick as sufficiently so as not to become exposed the electron supplying layer (106) at a region except a location of the open part (120b) in a case where there is designed to be performed the etching of the drift layer (105) and of the electron supplying layer (106) for the channel layer (104) till becoming to be exposed.

Figure 5:
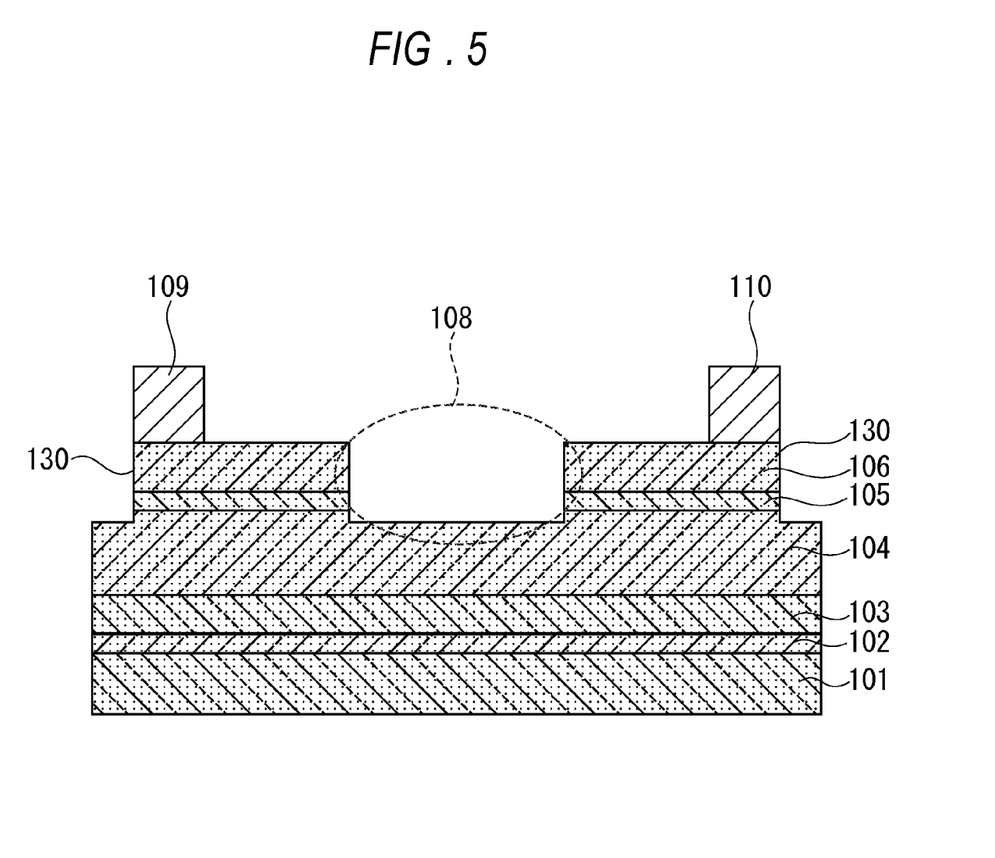
FIG. 5 is an explanatory drawing explaining a method of manufacturing a GaN-based field effect transistor in accordance with the one embodiment.

Next, there is designed to be performed a removing of the mask layer (120), and then thereafter there is designed to be performed a formation of the source electrode (109) and of the drain electrode (110) on to the electron supplying layer (106) by making use of a lift-off method, that are shown in FIG. 5. Moreover, there is designed for each of the source electrode (109) and of the drain electrode (110) to have a structure of Ti/Al that has each of layer thicknesses to be as 25 nm/300 nm, respectively. Furthermore, it is able to perform an accumulation of a metal film by making use of such as a method of a sputtering or a method of a vacuum evaporation or the like.

Figure 6:
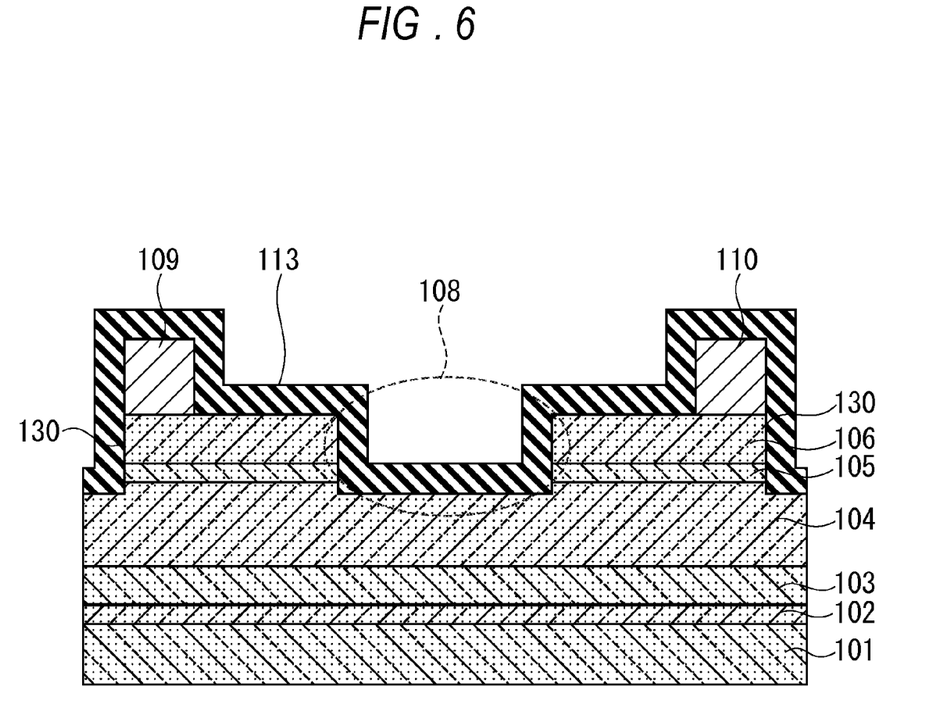
FIG. 6 is an explanatory drawing explaining a method of manufacturing a GaN-based field effect transistor in accordance with the one embodiment.

Next, there is designed to be performed a formation of a passivation layer (113) (a first insulating film) on to the surface of the recess part (108), on to the electron supplying layer (106), on to the source electrode (109), on to the drain electrode (110) and on to the part for isolating the device (130), that is in order to perform the protection of the electron supplying layer (106) at a period of performing an annealing in an alloying process that will be described in detail later by making use of the method of the PCVD with making use of a silane ($SiH_4$) and an nitrogen dioxide ($N_2O$) to be as the raw materials, that is shown in FIG. 6.

Next, there is designed to be performed the annealing at a temperature of 600° C. within ten minutes as the alloying process in order to obtain an ohmic contact for between the electron supplying layer (106) and the source electrode (109) or the drain electrode (110) respectively.

Figure 7:
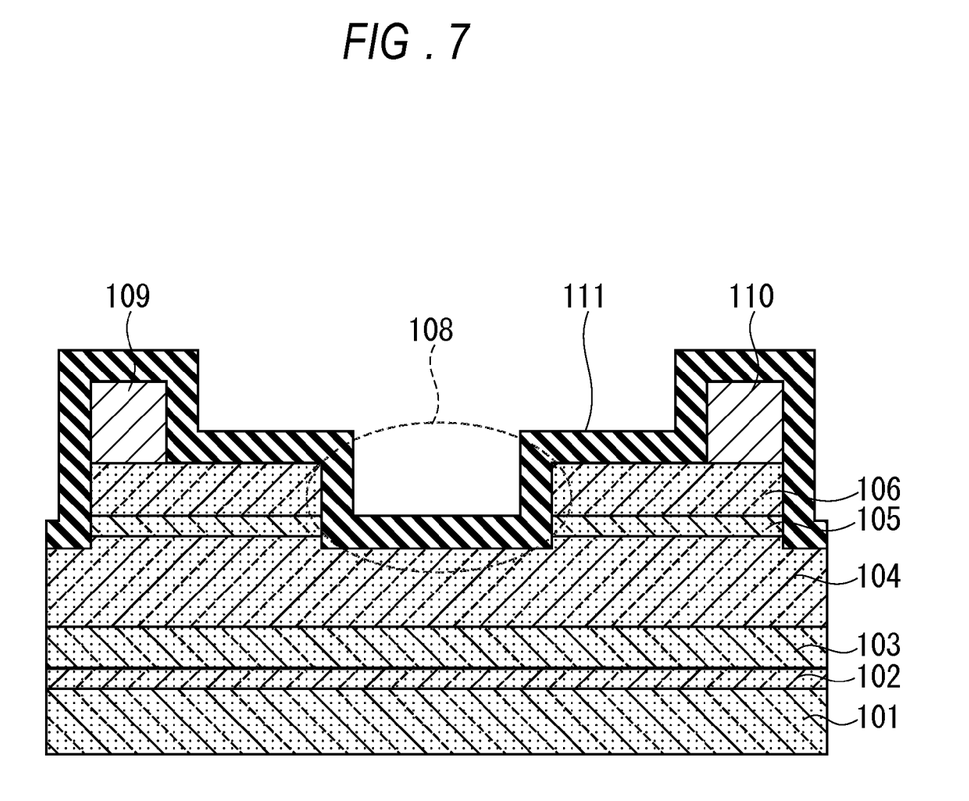
FIG. 7 is an explanatory drawing explaining a method of manufacturing a GaN-based field effect transistor in accordance with the one embodiment.

Next, there is designed for the passivation layer (113) to be removed by making use of a buffered hydrofluoric acid, and then thereafter there is designed to be performed a formation of the gate insulating film (111) on to the surface of the recess part (108), on to the electron supplying layer (106), on to the source electrode (109) and on to the part for isolating the device (130) by making use of the method of the PCVD with making use of $SiH_4$ and $N_2O$ to be as the raw materials, that becomes to have a layer thickness to be as approximately 60 nm, that are shown in FIG. 7.

Figure 8:
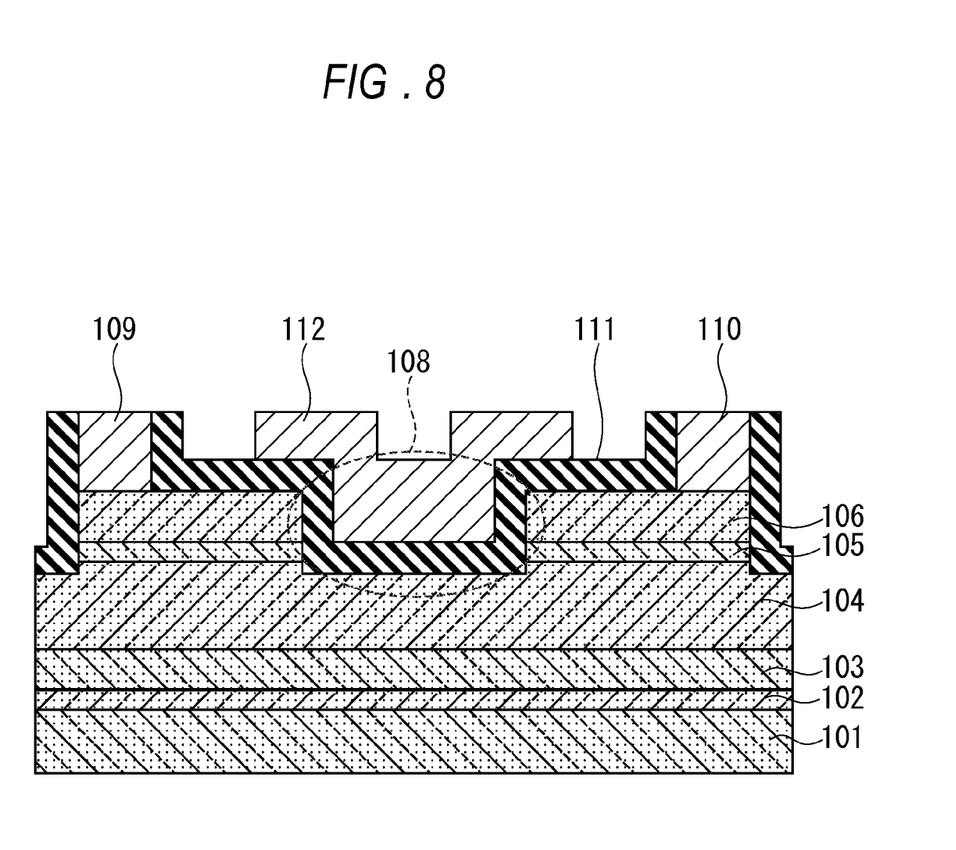
FIG. 8 is an explanatory drawing explaining a method of manufacturing a GaN-based field effect transistor in accordance with the one embodiment.

Next, there is designed to be performed a formation of the gate electrode (112) on to the gate insulating film (111) at the recess part (108), which becomes to have a structure of Ti/Al, that is shown in FIG. 8. And thus it becomes able to complete the MOSFET (100) that is shown in FIG. 1. Moreover, there is designed for an end part at a drain side of the gate electrode (112) to be performed a formation so as to be superimposed to the channel layer (104) and to the drift layer (105) via the gate insulating film (111). And then by performing a setting as properly regarding a length of a part that is to be superimposed it becomes able to obtain an effect of a field plate by which there becomes to be alleviated a concentration of an electric field between the gate and the drain. And hence it becomes able to perform an improvement of the breakdown voltage.

And thus in accordance with the method of manufacturing the GaN-based field effect transistor GaN-based regarding the first embodiment that is described above in such the manner it becomes able to reduce the damage on to the surface of the electron supplying layer (106) at the period of performing the alloying process, because there is designed to be performed such the alloying process in order to perform the ohmic contact under the state of which there is designed to be performed the formation of the passivation layer (113). Further, it becomes available for the reaction product of between the electron supplying layer (106) and the passivation layer (113) that is formed of the AlGaN to be performing the removing as well at the period of performing the removing of the passivation layer (113). Still further, it becomes able to reduce the interface state of between the electron supplying layer (106) and the gate insulating film (111), because there is designed to be performed the formation of such the gate insulating film (111) thereafter to be as afresh on to between the electron supplying layer (106) that is formed of the AlGaN and the passivation layer (113), that is designed to have a density of the interface state to be as lower. And then therefore it becomes able to realize the MOSFET (100) that becomes to receive the effect of the current collapse to be as smaller.

Still further, regarding such the current collapse that is mentioned above there is designed to be performed a measurement of an ON resistance (R1) of a transistor by performing such as an examination of the energizing or the like. And then thereafter there is designed to be performed a measurement of the ON resistance (R2) once again after setting to be as an OFF state. And then there is defined for a ratio of the R2 against the R1 to be as the amount of the collapse of such the transistor.

Still further, in accordance with the one example of the MOSFET (100) that is described above there is explained for the method of manufacturing with making use of the process as the example that is shown from FIG. 2 through FIG. 8. However, it is not to be limited to such the method of manufacturing, but it may be available if the method follows the process of which there is designed to perform the formation of a passivation layer for a period of annealing, and then thereafter there is designed to be performed an alloying process in order to perform an ohmic contact, and then after performing the removing of such the passivation layer there is designed to be performed a formation of a gate insulating film. Still further, it may be available to perform the etching for isolating a device after performing a formation of a gate electrode, or it may be available for the same to be performed at the same time of performing a formation of a recess part as well, for example.

Still further, in accordance with the one example of the method of manufacturing of the MOSFET (100) that is described above there is explained with making use of the $SiO_2$ as the example for the gate insulating film (111) that is designed to be performed the accumulation by making use of the method of the PCVD. However, it may be available as well for the method of performing the accumulation to be made use of another method of performing the accumulation, such as a method of an atmospheric plasma chemical vapor phase growing (APCVD) or a method of the spattering by making use of an electron cyclotron resonance (ECR) or the like, in addition to such the PCVD. Still further, it may be available for a nature of the gate insulating film (111) to be made use of another insulating film in addition to the $SiO_2$ that has an interface state density to be as lower and that has a withstanding against the breakdown voltage to be as higher, such as an AlN or an $Al_2O_3$ or a $Ga_2O_3$ or a $TaO_x$ or an SiON or the like.

Still further, in accordance with the one example of the method of manufacturing of the MOSFET (100) that is described above there is explained with making use of the SiN as the example for the insulating film (113) that is designed to be performed the accumulation by making use of the method of the PCVD. However, it may be available for a method of performing the accumulation to be made use of another method of an accumulation in addition to the PCVD, such as a method of a catalytic chemical vapor phase growing (Cat-CVD) or the method of the spattering by making use of the ECR or the like.

Still further, in accordance with the one embodiment in the above description there is described with making use of the structure of the AlGaN/GaN as the example for the combination of the drift layer (105) and the electron supplying layer (106). However, it may be possible in addition to such the structure to be applied a combination of a material system of such as an AlInGaN/GaN or a GaN/InGaN or a GaN/GaNAs or a GaN/GaInNAsP or a GaN/GaInNP or a GaN/GaNP or an AlGaNInNAsP/GaN or an AlGaN/AlInGaN or the like. Still further, it may be able to perform an introduction of a spacer layer that is designed to be formed of such as an AlN or the like in between the drift layer (105) and the electron supplying layer (106) in order to perform an improvement of the mobility of the layer (130) of the two dimensional electron gas.

Still further, in accordance with the first embodiment that is described above there is designed to be performed the formation of the drift layer (105) that is designed to be formed of the GaN-based semiconductor as the p-type and as the undope type in between the channel layer (104) and the electron supplying layer (106) respectively. However, the present invention is not to be limited to such the embodiment. That is to say, it may be possible for the present invention to be performed an application to an MOSFET that is designed to have a configuration of which there is designed to be performed a formation of the electron supplying layer (106) on to a channel layer that is designed to be formed of a GaN-based semiconductor as the p-type, but there is not designed to be performed a formation of any drift layer that is explained in each of the embodiments that are described above. For example, it may be possible for the present invention to be performed an application to an MOSFET that is designed to have a configuration of which there is not designed to be performed a formation of the drift layer (105) at the right side and the left side in the MOSFET (100) in accordance with the one embodiment that is shown in FIG. 1, and then there is designed for the electron supplying layer (106) to be performed a formation on to the channel layer (104) respectively, that is designed to be formed of the GaN-based semiconductor as the p-type. That is to say, in accordance with such the MOSFET the drift layer (105) becomes to be the channel layer (104) at the right side and the left side that is designed to be formed of the p-type GaN-based semiconductor.

Still further, in accordance with such the MOSFET there is designed to be performed a formation of the layer of the two dimensional electron gas on to a surface of the channel layer (104), but there is designed for a layer of the two dimensional electron gas not to be performed a formation at a region of the channel layer (104) as directly under the gate electrode (112), that is to say, the same is designed to be cut in a halfway. And then there is designed to be performed a formation of an inversion layer in the channel layer (104) as directly under the gate electrode (112) at a period of performing an application of a voltage to the gate electrode (112) in a forward direction to be as higher than or equal to a threshold voltage. Still further, by designing for such the inversion layer to be performed a connection with the layer of the two dimensional electron gas at the right side and the left side there is designed to be flowed a drain current. And thus it becomes able to obtain the operation of the field effect transistor as the normally OFF type.

Still further, in accordance with the first embodiment that is described above there is designed for a most top part of the MOSFET to be as the electron supplying layer that is designed to be formed of the AlGaN. However, the present invention is not to be limited to such the embodiment. And then it is available for the present invention to be performed an application to an FET that is designed to comprise a cap layer that is designed to be formed of an n-GaN or an i-GaN and to be formed on to the electron supplying layer (106). Furthermore, it becomes possible to reduce the interface state of between the electron supplying layer and the passivation layer in accordance with such the structure, because there is designed for the AlGaN layer not to be exposed on the surface that is designed to be as the electron supplying layer. And then therefore it becomes able to reduce the phenomenon of the collapse of the electrical current.

And thus as described above in such the manner, it becomes available for the GaN-based FET in accordance with the present invention to be as an MOSFET in which there becomes to have a higher breakdown voltage and to have the ON resistance to be as lower and to be difficult in receiving the effect of the variation of the characteristics due to the collapse of the electrical current.

Although the invention has been described with respect to specific embodiments for a complete and clear disclosure, the appended claims are not to be thus limited but are to be construed as embodying all modifications and alternative constructions that may occur to one skilled in the art that fairly fall within the basic teaching herein set forth.

What is claimed is:

1. A method of manufacturing a GaN-based field effect transistor, comprising the steps of:

performing an epitaxial growth of a channel layer that is formed of a GaN-based semiconductor on to a substrate;

performing an epitaxial growth of an electron supplying layer which is formed of a GaN-based semiconductor on to said channel layer, that has a larger band gap energy than that of said channel layer;

forming a recess part that has a bottom face to be as a surface of said channel layer, by etching and removing a part of said electron supplying layer, and then by exposing said surface;

forming a source electrode and a drain electrode on to said electron supplying layer;

forming a first insulating film on to a surface at an inner side of said recess part, on to said electron supplying layer, on to said source electrode and on to said drain electrode, respectively;

performing an alloying process in order to perform an annealing for said source electrode and for said drain electrode;

removing said first insulating film after performing said alloying process;

forming a second insulating film on to a surface at said inner side of said recess part, on to said electron supplying layer, on to said source electrode and on to said drain electrode, respectively; and forming a gate electrode on to said second insulating film at said recess part.

2. The method of manufacturing the GaN-based field effect transistor according to claim 1, comprising the additional step of:

forming a drift layer that is formed of a GaN-based semiconductor as a p-type or as an undoped for between said channel layer and said electron supplying layer.

3. The method of manufacturing the GaN-based field effect transistor according to claim 1, further comprising the additional step of:

forming a cap layer that is formed of an n-type GaN or an intrinsic GaN on to said electron supplying layer.

* * * * *